United States Patent
Cowley

(10) Patent No.: US 6,901,248 B1
(45) Date of Patent: May 31, 2005

(54) FREQUENCY CONVERTER AND RADIO FREQUENCY TUNER

(75) Inventor: Nicholas P Cowley, Wroughton (GB)

(73) Assignee: Zarlink Semiconductor Limited, Wiltshire (GB)

( * ) Notice: Subject to any disclaimer, the term of this patent is extended or adjusted under 35 U.S.C. 154(b) by 599 days.

(21) Appl. No.: 09/658,745

(22) Filed: Sep. 11, 2000

(30) Foreign Application Priority Data

Sep. 15, 1999 (GB) .............................. 9921813

(51) Int. Cl.$^7$ ............................... H04B 1/26
(52) U.S. Cl. ..................... 455/313; 455/318; 455/323; 455/196.1; 455/302; 348/731; 386/85; 386/108
(58) Field of Search ................................. 348/536, 735, 348/731–733, 725, 706; 725/38, 127; 386/46, 71, 76, 84–85, 108; 455/196.1, 246, 313, 318, 323, 302–306; 331/25

(56) References Cited

U.S. PATENT DOCUMENTS

| | | | | |
|---|---|---|---|---|
| 3,959,737 A | * | 5/1976 | Tanis ........................... 331/1 A |
| 3,975,898 A | * | 8/1976 | Nishimura ..................... 368/85 |
| 4,169,385 A | * | 10/1979 | Kellogg et al. ................ 73/610 |
| 4,422,052 A | * | 12/1983 | Yorkanis et al. ............. 330/295 |
| 4,792,987 A | * | 12/1988 | Tumeo ......................... 455/131 |
| 5,060,297 A | * | 10/1991 | Ma et al. ...................... 455/302 |
| 5,192,999 A | * | 3/1993 | Graczyk et al. ............. 348/552 |
| 5,999,802 A | * | 12/1999 | Aschwanden ............. 455/196.1 |
| 6,014,386 A | * | 1/2000 | Abraham ..................... 370/485 |
| 6,091,780 A | * | 7/2000 | Sointula ..................... 375/259 |
| 6,163,684 A | * | 12/2000 | Birleson .................. 455/182.3 |
| 6,169,569 B1 | * | 1/2001 | Widmer et al. ............. 725/111 |
| 6,307,599 B1 | * | 10/2001 | Komatsu ..................... 348/731 |
| 6,519,305 B1 | * | 2/2003 | Roth et al. ................... 375/376 |

* cited by examiner

Primary Examiner—Sonny Trinh
Assistant Examiner—Marcos L Torres
(74) Attorney, Agent, or Firm—Kirschstein, et al.

(57) ABSTRACT

A single conversion frequency converter comprises an image reject mixer and a local oscillator. The local oscillator comprises a variable frequency oscillator and a variable divider. The variable divider supplies to the mixer a local oscillator signal whose frequency is a sub-multiple of the frequency of the variable frequency oscillator.

10 Claims, 4 Drawing Sheets

FREQUENCY CONVERTER AND RADIO FREQUENCY TUNER

The present invention relates to a single conversion frequency converter for use in a radio frequency tuner. The present invention also relates to a radio frequency tuner comprising such a frequency converter. Such tuners have many applications but a particular application is to digital cable tuners for receiving from a cable distribution system radio frequency signals modulated with digital information.

The basic purpose of a frequency converter of a radio frequency tuner is to amplify a radio frequency signal and to convert its frequency to a fixed intermediate frequency for filtering and demodulation. Such tuners have the following performance requirements:

(1) To add as little noise to the signal as possible;
(2) To produce as low cross modulation as possible (cross modulation is amplitude modulation on an undesired channel causing modulation on the desired channel because of tuner non-linearities, for example of second and third order);
(3) To achieve as low intermodulation products within the desired band as possible (intermodulation is two channels or more beating together resulting in an additional distortion tone which may lie within the desired channel and is caused by similar non-linearities);
(4) To achieve low re-radiation of frequencies within the broadcast band;
(5) For digital applications, to achieve low "close in" noise degradation typically below 10 kHz;
(6) For digital applications, to add minimal differential group delay to the received channel;
(7) To add minimal gain ripple within the received channel;
(8) To provide minimal image channel interference;
(9) To allow for a wide dynamic range of incoming signals, both as a group and from channel to channel; and
(10) To provide good selectivity of a desired weak channel in the presence of strong undesired channels.

FIG. 1 of the accompanying drawings illustrates part of a known type of single conversion tuner. The tuner comprises a frequency converter 1 whose output is connected to an intermediate frequency (IF) amplifier 2 which provides an IF output. The frequency converter 1 is controlled by a phase-locked loop (PLL) synthesiser 3 which is part of the frequency converter but which is shown separately in FIG. 1.

For practical reasons, a frequency converter can operate over a frequency range which is typically limited to about one octave. Thus, in order to cover a wider frequency range, the whole frequency range has to be split into several (typically three) bands. The frequency converter 1 is then embodied as several substantially identical channels (three shown in FIG. 1) cooperating with a common synthesiser 3.

The channel for band 1 is shown in FIG. 1, the other channels being substantially identical. The channel comprises a band limit filter 4 whose input is connected to the RF input of the tuner and whose output is connected via a tracking local oscillator reject filter 5, a buffer stage 6, and an image reject filter 7 to a mixer oscillator 8 comprising a mixer 9 and a local oscillator 10. The output of the mixer/oscillator 8 is connected via another buffer stage 11 to the amplifier 2.

The filters 5 and 7 and the local oscillator 10 are connected to the synthesiser 3. The synthesiser 3 controls the frequency of the local oscillator 10, which forms part of a phase-locked loop including the synthesiser 3, and controls the tracking of the filters 5 and 7 so that the local oscillator reject filter 5 tracks the frequency of the local oscillator 10 and the image reject filter 7 tracks the image channel corresponding to the local oscillator frequency.

The single conversion tuner shown in FIG. 1 requires the filters 4 and 7 to filter out or attenuate all undesired channels so that the single desired channel is supplied to the mixer 9 where it is down-converted to the intermediate frequency i.e. the intermediate frequency is below the frequency of the received channel. The filters 4 and 7 suppress undesired channels so as to minimise cross modulation and intermodulation. The image reject filter 7 suppresses the image channel and the local oscillator reject filter 5 suppresses leakage of the local oscillator signal to the RF input.

Because the filters 5 and 7 have to be tracking filters, they cannot achieve the selectivity performance of fixed filters. As a result, cross modulation and intermodulation performance of the tuner suffers. Similarly, differential group delay and gain ripple performance is worse than for fixed filters.

Because the local oscillator frequency usually lies within the received broadcast band, various measures and careful design are required in order to reduce re-radiation to an acceptable level. Also, because each local oscillator 10 has to tune over a wide range and must have a relatively small frequency step size, "close-in" phase noise performance is relatively poor.

Although the mixer oscillator 8 and the synthesiser 3 can be formed in a single integrated circuit in a cost-effective manner, further "up-integration" is not at present cost-effective.

FIG. 2 of the accompanying drawings illustrates another known type of tuner of the double conversion type. The tuner comprises a band limit filter 20 connected to the RF input. The filtered signals are supplied to a variable gain amplifier 21 which receives an automatic gain control (AGC) signal for controlling its gain so as to reduce the range of signal levels at its output.

The output of the amplifier 21 is supplied to the first frequency converter in the form of an "up" mixer/oscillator 22 comprising a mixer 23 and a local oscillator 24 controlled by an "up" phase-locked loop synthesiser 25. The up mixer/oscillator 22 converts the whole of the signal band limited by the filter 20 to a fixed intermediate frequency which is higher than the received band. The output of the mixer/oscillator 22 is connected via a fixed image reject filter 26 to a second frequency converter in the form of a down mixer/oscillator 27 comprising a mixer 28 and a local oscillator 29 controlled by a "down" phase-locked loop synthesiser 30.

The mixer/oscillator 27 converts the desired channel to a lower intermediate frequency which is typically the same intermediate frequency as for the single conversion tuner shown in FIG. 1. The output of the mixer/oscillator 27 is connected via an amplifier 31 to supply an IF output.

In order to provide up-conversion of the whole received frequency band, the first converter 22 is required to have high signal handling capabilities so as to minimise cross modulation and intermodulation. The up-converter has a wide tuning range and hence potentially a poor phase noise performance. Compensation for this is achieved by applying a coarse step size low noise phase-locked loop which controls the "closein" phase noise. The down-converter 27 has a very narrow tuning range and so can have a good phase noise performance. Small fine tuning steps may therefore be used for accurate tuning alignment.

The up-converter 22 must be carefully designed so as to provide adequate cross modulation and intermodulation performance. However, the double conversion tuner has a poorer selectivity performance of desired weak channels in the presence of strong undesired channels.

Double conversion tuners of the type shown in FIG. 2 comprise two oscillators 24 and 29 which are always running and which may interfere which each other or generate spurious mixing products by cross mixing. In practice, it is very difficult to achieve the necessary level of isolation between the local oscillators in a single integrated circuit implementation of a double conversion tuner using conventional low-cost packaging. Also, to achieve the required dynamic range, both the frequency changers have to operate at the maximum power dissipation allowable in a given package. This makes it difficult to combine an up converter and a down converter in a single package because of the power constraints. Further, a double conversion tuner comprises two synthesisers as well as the up- and downconverters. This results in a large area of circuitry which is difficult to integrate in a cost-effective manner, even if the problems of interference and power dissipation using a single package can be overcome economically.

WO/19708843 discloses a complex arrangement in the form of a general purpose module which is capable of receiving signals over a very wide radio frequency range. In one of its modes of operation this arrangement appears to perform a single conversion with a mixer receiving a local oscillator signal via switchable dividers with the options of a divert connection.

GB 2 188 804 discloses a frequency synthesiser in which the mixer receives an oscillator signal from the output of a multiplexer. The inputs of the multiplexer are connected such that the mixer receives the oscillator signal: directly from the local oscillator; via a divide-by-two circuit; via a divide-by-four circuit and the divide-by-two circuit connected in cascade.

GB 1 420 271 discloses a frequency changer having a crystal-controlled local oscillator whose outputs are supplied to a mixer via integral dividers providing division ratios of 20, 15, 12 and 10.

According to a first aspect of the invention, there is provided a single conversion frequency converter comprising a mixer and a local oscillator, the local oscillator comprising a variable frequency oscillator and a variable divider for receiving from the variable frequency oscillator a variable frequency signal and for supplying to the mixer a local oscillator signal whose frequency is equal to the frequency of the variable frequency signal divided by any selected one of a plurality of integers, each of which is greater than one, characterised in that the mixer is an image reject mixer.

The variable divider may comprise a plurality of divide-by-two stages and a multiplexer whose inputs are connected to respective outputs of the divide-by-two stages. The variable frequency oscillator may be tuneable over a frequency range which is greater than or equal to one octave.

The variable frequency oscillator may comprise part of a frequency synthesiser.

The mixer may be connected to a signal source via a non-frequency-selective signal path.

The input of the mixer may be connected to a signal input via an automatic gain control circuit.

The input of the mixer may be connected to a signal input via a plurality of input stages.

The converter may comprise a single chip integrated circuit.

According to a second aspect of the present invention, there is provided a radio frequency tuner comprising a converter according to the first aspect of the invention.

The tuner may comprise a digital tuner.

The tuner may comprise a cable tuner.

The tuner may comprise a single chip integrated circuit.

It is thus possible to provide a frequency converter and a tuner of the single conversion type so that the problems associated with preventing interference between two local oscillators of a double conversion tuner are eliminated. Further, the power dissipation problems associated with having two frequency changers are eliminated. In addition, only a single synthesiser is necessary so that all of the circuitry can be implemented in a single chip integrated circuit in a highly cost-effective manner.

Such a frequency changer and tuner enjoy all of the advantages of conventional single conversion architectures. In addition, the local oscillator frequency is outside the received signal band so that a local oscillator reject filter for preventing re-radiation from the input is unnecessary. Further, leakage of the local oscillator signal to the input of the mixer can be held to a sufficiently low level to avoid any significant interference.

The absence of tracking filters between the frequency converter and the input removes another source of degradation of tuner performance. In particular, differential group delay and gain ripple caused by tracking filters are eliminated. Thus, in addition to enjoying the benefits of single conversion architecture, many of the benefits associated with double conversion architecture are also achieved. It is therefore possible to achieve single chip integration in a cost-effective way of a tuner which may, for example, be used as a single chip digital cable tuner.

The use of what amounts to band-switching within the local oscillator removes the need to divide a frequency converter into several channels. The frequency converter itself and the interfacing with a common synthesiser may therefore be simplified.

The invention will be further described, by way of example, with reference to the accompanying drawings, in which.

Like reference numerals refer to like parts throughout the drawings.

Figure 1:
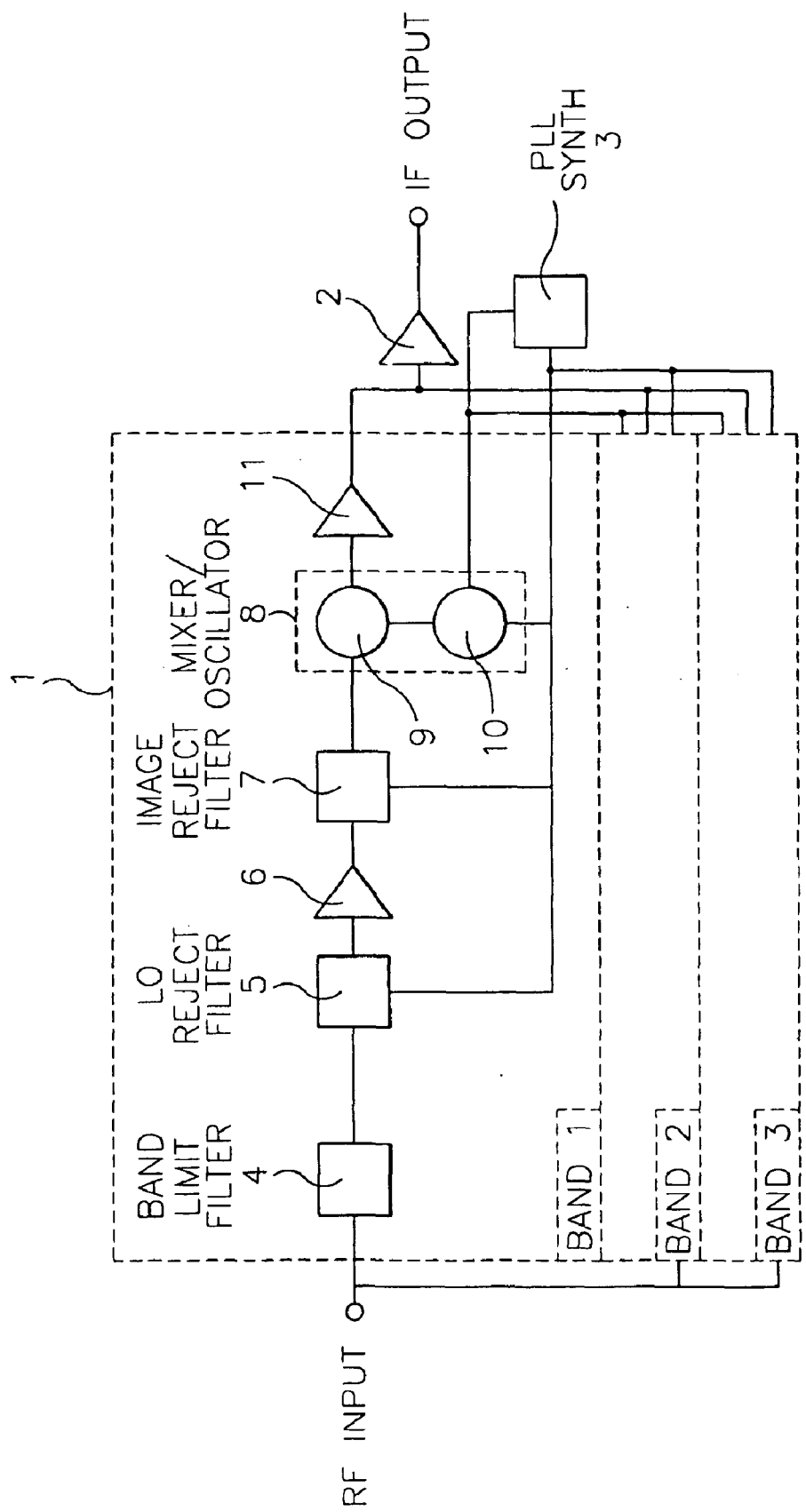
FIG. 1 is a block circuit diagram of part of a known type of single conversion tuner.
Figure 2:
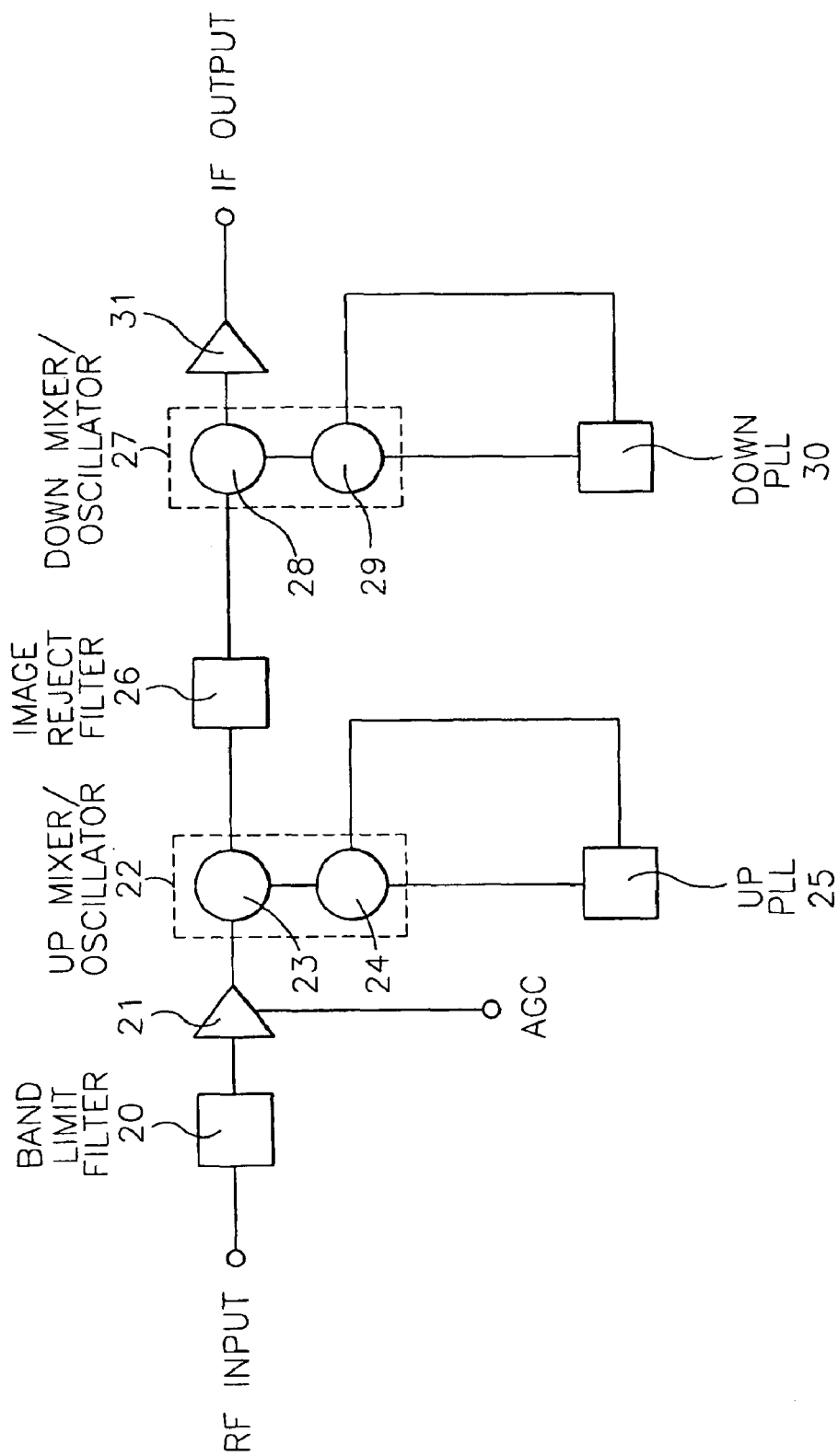
FIG. 2 is a block circuit diagram of a known type of double conversion tuner.
Figure 3:
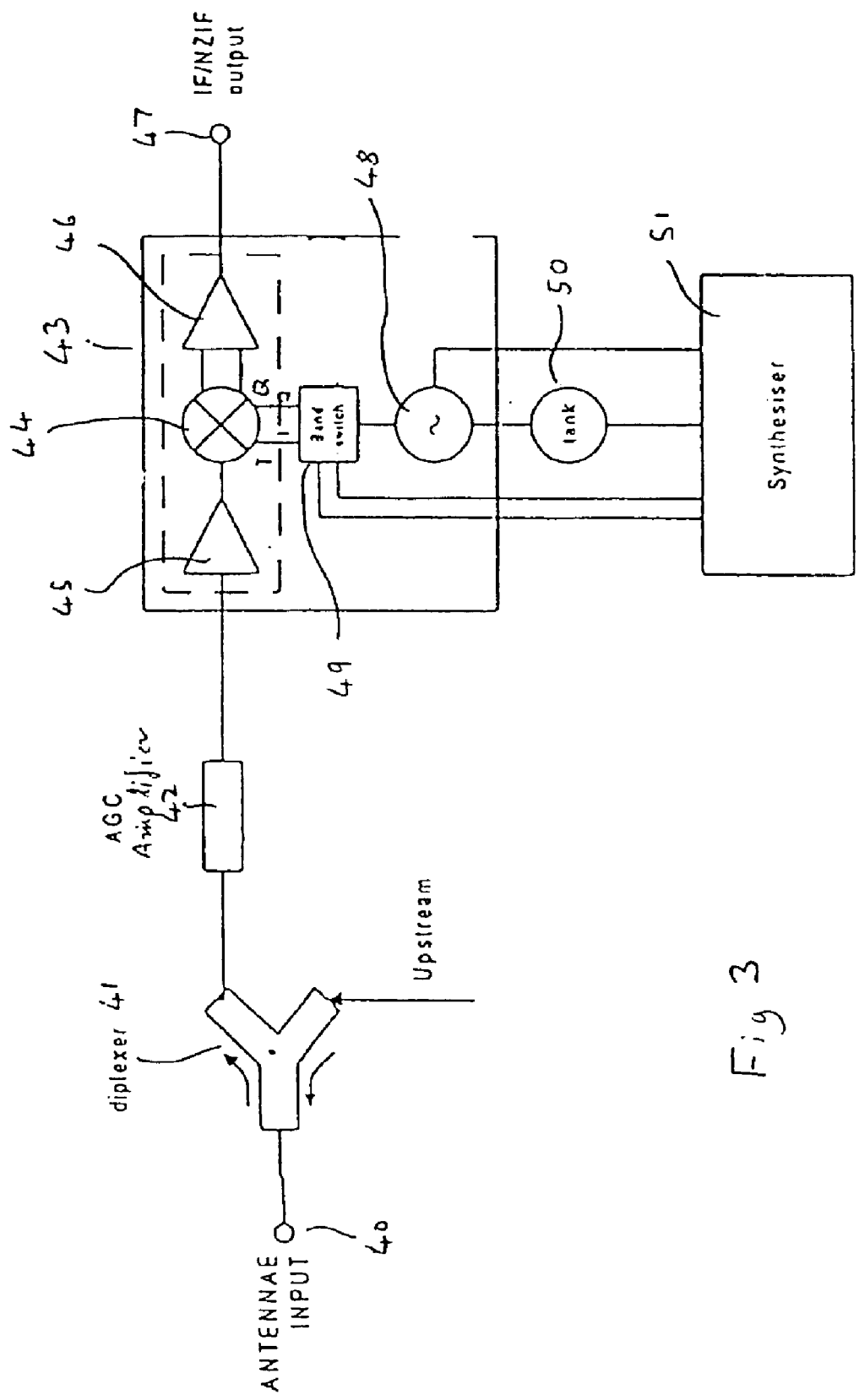
FIG. 3 is a block circuit diagram of a frequency converter and tuner constituting an embodiment of the invention.

FIG. 3 shows a frequency converter and part of a radio frequency tuner. By way of example, the tuner is of the type for use with a cable distribution network having a common antennae input 40 and connected to the tuner by a diplexer 41. The tuner comprises an automatic gain control amplifier 42 whose input is connected to the diplexer 41 and whose output is connected to a single conversion frequency converter 43. The frequency converter 43 comprises a mixer 44 of the image reject type which receives input signals via a buffer stage 45 from the AGC amplifier 42 and supplies via a further buffer stage 46 standard intermediate frequency (IF) signals or near zero intermediate frequency (NZIF) signals to an output 47.

The frequency converter 43 also comprises a local oscillator which supplies in-phase (I) 1 and quadrature (Q) local oscillator signals to the mixer 44. The local oscillator comprises a variable frequency oscillator 48 whose output is connected to a band-switching arrangement 49. The oscillator 48 has a tank circuit 50 which determines the frequency of oscillation and which is controlled by a synthesiser 51 of the phase-locked loop type. The synthesiser 51 also controls band switching by the arrangement 49.

Figure 4:
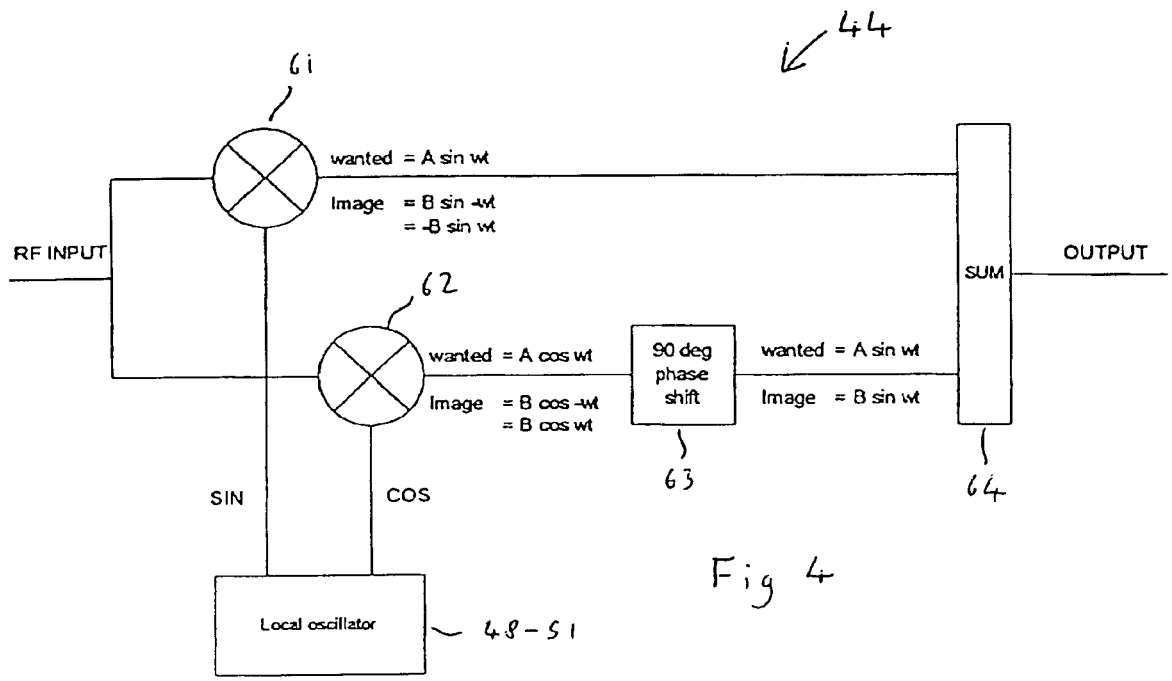
FIG. 4 is a block circuit diagram illustrating a possible implementation of an image reject mixer of the frequency converter shown in FIG. 3.

Although any type of image reject mixer may be used as the mixer 44, FIG. 4 illustrates a particular type of image reject mixer purely by way of example. The image reject mixer comprises first and second mixing circuits 61 and 62 which receive the RF input signal and which receive in-phase (SIN) and quadrature (COS) signals from the local oscillator. The mixing circuit 61 supplies a wanted signal in the form of A.sin(wt) and an image signal B.sin(−wt)=−B.sin(wt). The mixing circuit 62 supplies a wanted signal A.cos (wt) and an image signal B.cos (−wt)=B.cos (wt). The wanted and image signals from one of the mixers 62 are supplied to a 90° phase shifting circuit 63 which converts the wanted signal to A.sin (wt) and the image signal to B.sin (wt). The outputs of the mixing circuit 61 and the phase shifter 63 are supplied to a summing circuit 64 in which the wanted signals add together whereas the image signals cancel each other out.

Figure 5:
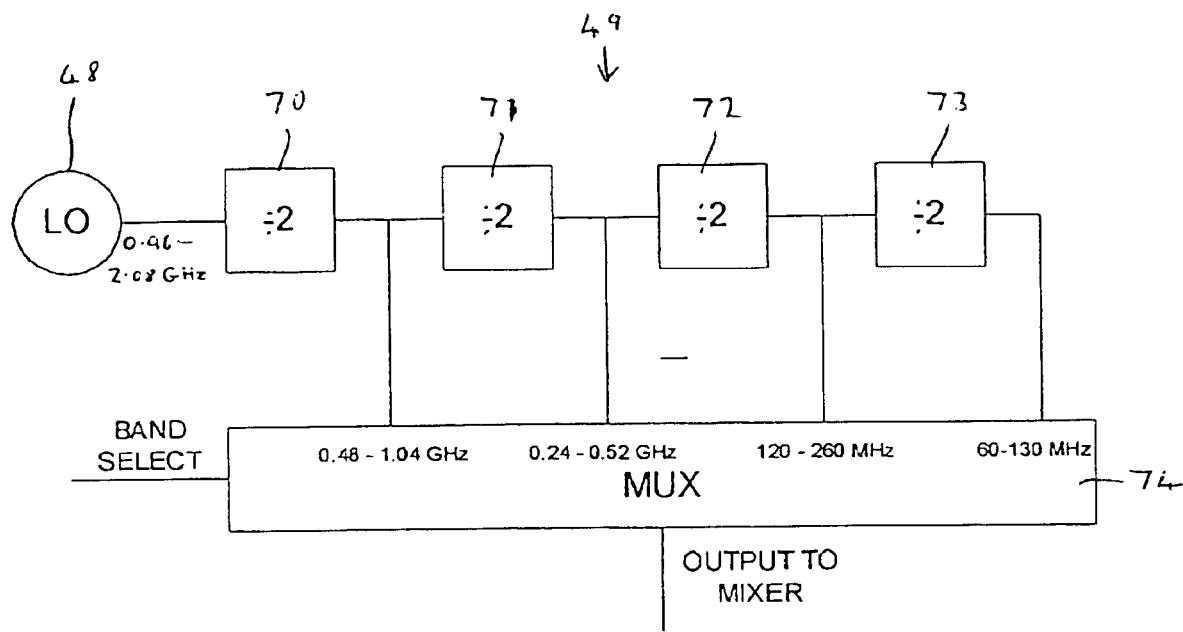
FIG. 5 is a block circuit diagram of a reference oscillator of the frequency converter of FIG. 3.

FIG. 5 illustrates diagrammatically the variable frequency oscillator 48 and the band-switching arrangement 49. The arrangement 49 comprises four cascade-connected divide-by-two circuits 70 to 73 whose outputs are connected to a multiplexer 74. The multiplexer 74 receives a band select signal from the synthesiser 51 which selects which of the outputs of the divide-by-two circuits 70 to 73 is connected to the output of the multiplexer 74 and hence to the mixer 44.

The frequencies shown in FIG. 5 are typical of those used, for example, to select channels from a cable distribution system of the type illustrated diagrammatically in FIG. 3. Thus, the oscillator 48 produces output signals which are tuneable over a range of slightly more than one octave, in this case from 0.96 to 2.08 GHz. The multiplexer 74 thus selects from frequency bands of 0.48–1.04 GHz, 0.24–0.52 GHz, 120–260 MHz and 60–130 MHz. When used with an intermediate frequency of, for example, 36 MHz in the case of UK applications, this gives a tuning range of 24 to 920 MHz, which more than adequately covers the broadcast range.

The whole of the circuitry shown in FIG. 3 may be implemented in the form of a single chip integrated circuit. The output 47 is connected to other devices, such as an IF filter/amplifier arrangement and a quadrature amplitude modulation decoder and such devices may also be implemented on the same single chip integrated circuit to provide a single chip digital front end interface module.

It is thus possible to provide a single integrated circuit comprising all of the circuitry of a digital tuner which may be manufactured in a cost-effective way in a conventional package. The amount of circuitry is consistent with such a package as is the power dissipation. No costly or complicated isolation techniques are necessary and a single-chip tuner meeting the performance criteria of a digital cable tuner, or indeed any other type of tuner, can be provided.

What is claimed is:

1. A single conversion radio frequency tuner, comprising: a single conversion frequency converter including an image reject mixer and a local oscillator, the local oscillator comprising a variable frequency oscillator and a variable divider between the mixer and the variable frequency oscillator, the variable divider receiving from the variable frequency oscillator a variable frequency signal and supplying to the mixer a local oscillator signal whose frequency is equal to a frequency of the variable frequency signal divided by any selected one of a plurality of integers, each of which is greater than one.

2. The tuner as claimed in claim 1, in which the variable divider comprises a plurality of divide-by-two stages having respective outputs and a multiplexer having inputs connected to the respective outputs of the divide-by-two stages.

3. The tuner as claimed in claim 2, in which the variable frequency oscillator is tuneable over a frequency range which is at least one octave.

4. The tuner as claimed in claim 1, in which the variable frequency oscillator comprises a part of a frequency synthesizer.

5. The tuner as claimed in claim 1, comprising a non-frequency-selective signal path connecting the mixer to a signal source.

6. The tuner as claimed in claim 1, comprising a signal input an automatic gain control circuit between the signal input and the mixer.

7. The tuner as claimed in claim 1, comprising a signal input and a plurality of input stages between the signal input and the mixer.

8. The tuner as claimed in claim 1, formed as a single chip integrated circuit.

9. The tuner as claimed in claim 1, formed as a digital tuner.

10. The tuner as claimed in claim 1, formed as a cable tuner.

* * * * *